(12) United States Patent
Frank et al.

(10) Patent No.: US 7,342,301 B2
(45) Date of Patent: Mar. 11, 2008

(54) CONNECTION DEVICE WITH ACTUATING ELEMENT FOR CHANGING A CONDUCTIVE STATE OF A VIA

(75) Inventors: David J. Frank, Yorktown Heights, NY (US); Kathryn W. Guarini, Yorktown Heights, NY (US); Christopher B. Murray, Ossining, NY (US); Xinlin Wang, Poughkeepsie, NY (US); Hon-Sum Philip Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/430,477

(22) Filed: May 9, 2006

(65) Prior Publication Data

US 2006/0214301 A1    Sep. 28, 2006

Related U.S. Application Data

(62) Division of application No. 10/622,709, filed on Sep. 15, 2003, now Pat. No. 7,074,707.

(51) Int. Cl.
*H01L 23/12* (2006.01)
*H01L 21/4763* (2006.01)

(52) U.S. Cl. ............... 257/700; 257/758; 257/774; 257/E23.164; 438/622; 438/629; 438/639

(58) Field of Classification Search ............... None
See application file for complete search history.

(56) References Cited

U.S. PATENT DOCUMENTS

| 4,015,282 A * | 3/1977 | Shaw ................. 257/2 |
| 6,469,364 B1 * | 10/2002 | Kozicki ............... 257/529 |
| 6,815,266 B2 * | 11/2004 | Rodgers et al. ........ 438/133 |
| 6,893,885 B2 * | 5/2005 | Lemmerhirt et al. ..... 438/17 |
| 7,074,707 B2 * | 7/2006 | Frank et al. .......... 438/622 |
| 7,102,983 B2 * | 9/2006 | Gibson ................ 369/126 |
| 2003/0081533 A1 * | 5/2003 | Gibson ................ 369/126 |

* cited by examiner

*Primary Examiner*—Alonzo Chambliss
(74) *Attorney, Agent, or Firm*—F. Chau & Associates, LLC

(57) ABSTRACT

A connection device includes a plurality of re-configurable vias that connect a first metal layer to a second metal layer. An actuating element is disposed between the first metal layer and the second metal layer. The actuating element changes the configuration of the plurality of re-configurable vias to change the plurality of re-configurable vias between a conductive state and a non-conductive state.

16 Claims, 7 Drawing Sheets

CONNECTION DEVICE WITH ACTUATING ELEMENT FOR CHANGING A CONDUCTIVE STATE OF A VIA

CROSS-REFERENCE TO RELATED APPLICATION

This is a divisional application of U.S. application Ser. No. 10/662,709 filed on Sep. 15, 2003, now U.S. Pat. No. 7,074,707 the disclosure of which is herein incorporated by reference in its entirety.

BACKGROUND OF THE INVENTION

1. Field of the Invention

The present invention relates to integrated circuits, and more particularly to an apparatus for connecting layers of integrated circuits.

2. Description of Related Art

All computer chips today function as essentially two-dimensional arrays, with devices placed next to one another. Such an arrangement has significant disadvantages. For example, the number of devices on a chip grows as the inverse square of the size of the devices, but the number of connections of the chip can grow, at most, linearly with the inverse of the size. Thus, as the number of devices on a chip increases, there is more competition among the devices for communication lines on and off the chip, resulting in an increase in communication delays.

A solution to the problems presented by two-dimensional intergated circuits is to manufacture three-dimensional integrated circuits (3D ICs) with devices stacked in piles. Connections between one layer and the one underneath can grow as rapidly as the number of devices and be very short, significantly increasing overall speed compared with two chips sided by side. The layers of integrated circuits can be, for example, logic circuits, memory circuits, mixed-signal circuits, or sensors. In addition, devices can reside on different layers to form a complete circuit.

SUMMARY OF THE INVENTION

In the manufacture of integrated circuits, there arises the need to connect one or more layers of integrated circuits with another layer of integrated circuits. Even for ICs on a single chip, it is often desirable to reconfigure the system during system operation to optimize system performance. In some cases, it may be advantageous to configure the connection between devices and circuits within a single layer or between different layers in a dynamic fashion, so as to dynamically alter the connections during system operation. For example, a certain section of a circuit can be turned on and off for reasons such as, for example, power savings or turning a low impedance short into a high impedance open, such as by switching passive elements (MIM caps, inductors) in and out of the circuit. For these applications, the switching frequency should be much lower than the clock frequency of the chip.

One exemplary embodiment of the connection device according to the invention includes a plurality of re-configurable vias that connect a first metal layer to a second metal layer. An actuating element is disposed between the first metal layer and the second metal layer. The actuating element changes the plurality of re-configurable vias between a conductive state and a non-conductive state.

In embodiments of the invention, the re-configurable vias are re-configurable phase change vias, and the actuating element is a heating element. The heating element can be a reistive heating element that heats up the re-configurable phase change vias to change the re-configurable phase change vias between a conductive state and a non-conductive state.

In embodiments of the invention, the plurality of re-configurable phase change vias include pillars made of $Ge_2Sb_2Te_5$ (GST).

In an exemplary embodiment of the method of forming a connection device according to the invention, a first dummy layer is formed over a first metal layer. An actuating layer is formed over the first dummy layer. A second dummy layer is formed over the actuating element. A second metal layer is formed over the second dummy layer. A plurality of re-configurable vias is formed through the first dummy layer, the actuating layer and the second dummy layer and between the first metal layer and the second metal layer.

These and other objects, features and advantages of the present invention will become apparent from the following detailed description of illustrative embodiments thereof, which is to be read in connection with the accompanying drawings.

BRIEF DESCRIPTION OF THE DRAWINGS

The invention will be described in detail in the following description of preferred embodiments with reference to the following figures wherein.

DETAILED DESCRIPTION OF PREFERRED EMBODIMENTS

Figure 1:
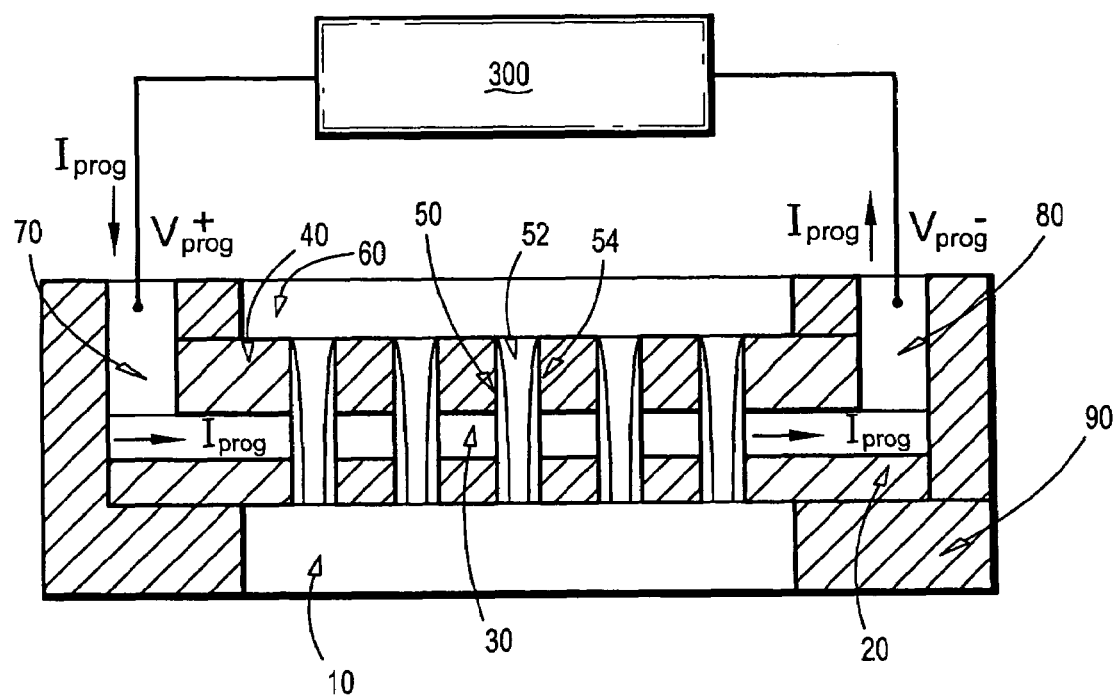
FIG. 1 is a side sectional view of first exemplary embodiment of the connection device according to the invention.

FIG. 1 shows an exemplary embodiment of the connection device according to the invention. The connection device 1 includes a first metal layer 10, a first dielectric layer 20 formed over the first metal layer 10, an actuating element 30 formed over the first dielectric layer 20, a second dielectric layer 40 formed over the heating element 30, and a second metal layer 60 formed over the second dielectric layer 40. A plurality of re-configurable vias 50 connect the first metal layer 10 and the second metal layer 60 through the first dielectric layer 20, the heating element 30 and the second dielectric layer 40. Contacts 70 and 80 are connected to the actuating element 30 on either side of the second metal layer 60. Interlayer dielectric material 90 is formed on the sides of the first metal layer 10 and the second metal layer 60.

In exemplary embodiments of the invention, the re-configurable vias are re-configurable phase change vias in which conductivity of the vias is changed by altering the phase of the via material. However, it should be appreciated that the re-configurable vias can be any other type of vias that are able to change from a high conductive state to a low conductive state. For example, the re-configurable vias can include a magnetic tunnel junction (MTJ), in which the tunneling current depends on the relative orientation of magnetizations of two ferromagnetic layers, which can be changed by an applied magnetic field.

In the present embodiment of the invention, each re-configurable phase change via 50 includes a pillar 52 and a spacer 54. The spacer 54 surrounds the pillar 52. The pillar 52 is made of a phase change material. The phase change material can be any suitable phase change material, preferably chalcogenides, such as, for example, GST ($Ge_2Sb_2Te_5$). A chalcogenide material has a variable resistivity depending on the crystalline state of the material. In an amorphous state, the resistivity of the material is high, whereas in the crystalline state, the resistivity of the material is low. The phase conversion can be accomplished by appropriate heating and cooling of the chalcogenide material. Once the chalcogenide material melts, the material loses all crystalline structure, and rapid cooling of the material to below its glass transition temperature causes the material to be locked into its amorphous state. The amorphous phase is very stable near room temperature, but the rate of nucleation and growth of crystallites increases exponentially as the melting temperature is approached. To keep the material from recrystallizing during cooling, the cooling rate must be faster than the crystal nucleation and growth rate. To switch the chalcogenide material to its conductive state, the material can be heated to a temperature between the glass transition temperature and the melting temperature, causing nucleation and crystal growth to rapidly occur over a period of several nanoseconds.

The typical resistivity of a chalcogenide material in the crystalline state is about $5 \times 10^{-3}$ $\Omega$-$cm^2$. The ratio between the resistivity of the chalcogenide material in its crystalline state and the ratio of the chalcogenide material in its amorphous state can be up to $10^6$. The resistivity of GST, for instance, can be tuned by doping the GST with nitrogen.

The actuating element 30 in the present embodiment can be any suitable resisitive heating element, such as, for example, a layer of polysilicon. It should be appreciated that the actuating element 30 can be any other element that can change the re-configurable vias 50 between a conductive state and a non-conductive state. For example, if the vias 50 include a magnetic tunnel junction, then the actuating element 30 can be an element that applies a variable magnetic field, such as an electromagnetic circuit.

In the present embodiment, a programming circuit 300 is electrically connected to the connection device 1 through the first contact 70 and the second contact 80. The programming circuit 300 can be any suitable circuit that generates, controls and inputs a programming voltage Vprog to the contacts 70 and 80, which in turn varies the current through the actuating element 30. The programming circuit 300 inputs a programming voltage Vprog$^+$ to the first contact 70 to create a current Iprog from the first contact 70 to the second contact 80 through the actuating element 30. The current Iprog is applied as a short pulsed current through the actuating element 30, which in turn heats up due to its electrical resistance. The short pulsed current through the actuating element 30 provides Joule heat to the pillar 50 made of phase change material to induce phase change. To perform a SET operation on the connection device 1, the programming circuit 300 provides a low current Iprog through the actuating element 30, which in turn heats up, but does not melt, the pillars 50 to permit crytallization (low resistivity state). To perform a RESET operation on the connection device 1, the programming circuit 300 provides a high current Iprog through the actuating element 30, which in turn melts the pillars 50. Subsequent cooling of the pillars 50 places the pillars in the amorphous state (high resistivity state). The SET and RESET operations are reversible and occur in less than 100 ns.

The spacers 54 electrically insulate the pillars 52 from the actuating element 30. The spacers 54 can be made of any suitable electrical insulating material, such as, for example, silicon dioxide. In other embodiments of the invention, rather than using spacers 54, the pillars 52 can be electrically isolated from the actuating element 30 by forming a p-n junction between the pillars 52 and the actuating element 30. For example, an n-doped polysilicon layer can be used as the actuating element 30, which forms a p-n junction with a pillar 52 made of GST. Using a p-n junction rather than a spacer improves thermal contact between the actuating element 30 and the pillar 52.

In general, the programming current Iprog is preferably small to reduce power consumption and eliminate the need to deliver a very large current during programming. In various exemplary embodiments of the invention, the current Ivia that flows through the pillars 52 between layers of a three-dimensional integrated circuit is separate from the programming current Iprog that allows for Joule heating of the pillars 52. This allows for the use of a small programming current Iprog to control the resistivity of the pillars 52, which in turn can pass large currents Ivia without inducing phase change.

Figure 2:
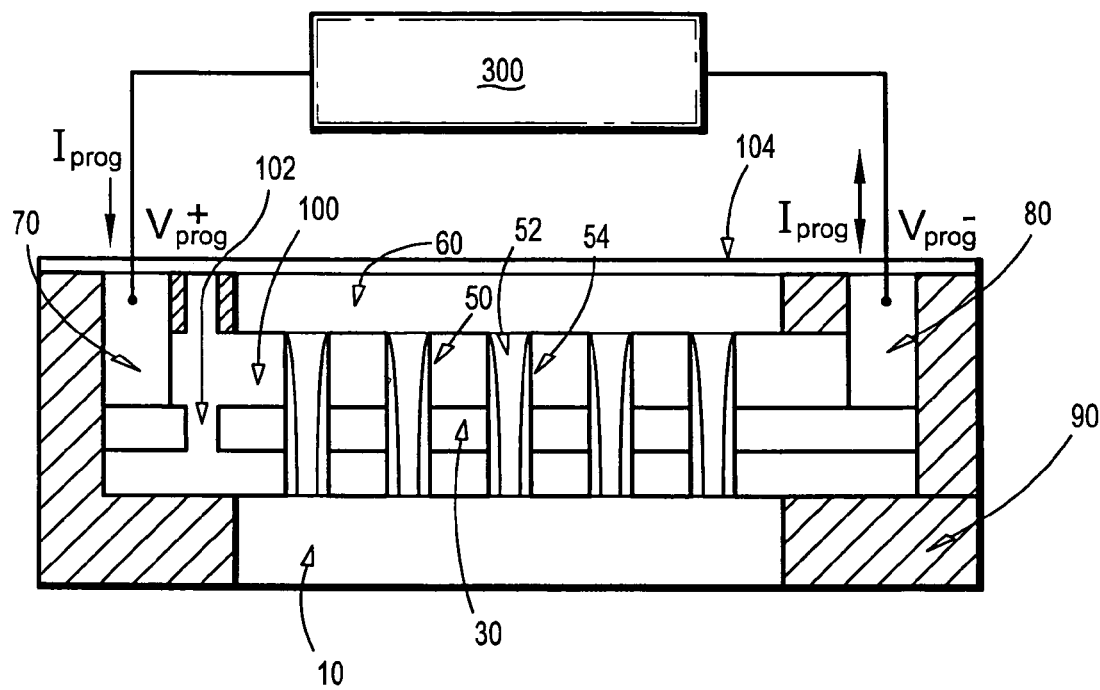
FIG. 2 is a side sectional view of a second exemplary embodiment of the connection device according to the invention.
Figure 3:
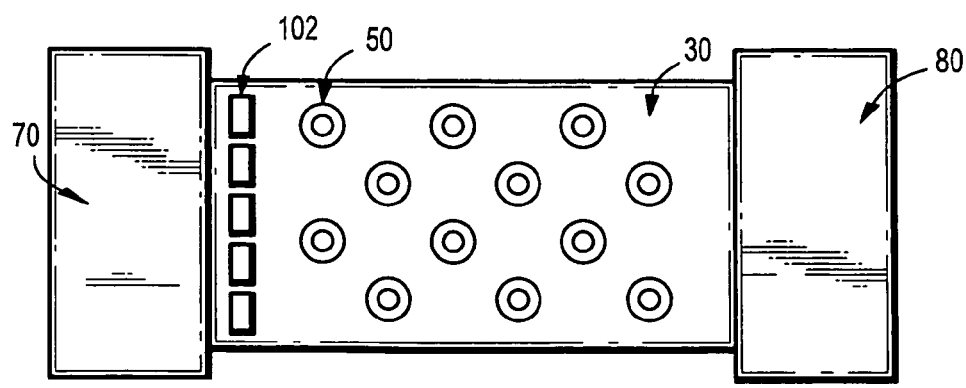
FIG. 3 is a top sectional view of the second exemplary embodiment of the connection device according to the invention.

FIG. 2 shows a second exemplary embodiment of the connection device according to the invention. As shown in FIG. 2, the structure of the connection device 2 according to the second embodiment differs from the first embodiment by including an air gap 100 between the heating element 30 and the metal layers 10 and 60. The dielectric layers 20 and 40 are removed in the second embodiment to form the air gap 100. The air gap 100 thermally isolates the vias 50 to allow for more efficient heating of the vias 50. FIG. 3 shows a top sectional view of the connection device according to the second exemplary embodiment of the invention. As discussed in further detail below, tap holes 102 are formed through the interlayer dielectric 90 and the heating element 30 to allow for removal of the dielectric layers 20 and 40. Although FIG. 3 shows the tap holes 102 formed only on one side of the device, it should be appreciated that the tap holes can be formed on either or both sides. A dielectric layer 104 is formed over the tap holes 102 to seal off the tap holes 102.

FIGS. 4-13 show the various steps of an exemplary embodiment of the method of fabricating a connection device according to the invention. The method according to this exemplary embodiment is applied to a substrate 113. The substrate 113 includes active and passive devices (not shown), a metallization layer 115 that interconnects the active devices, and an interlayer dielectric 117 formed around the metallization layer 115. The metallization layer 115 can be any suitable metallization layer, such as, for example, aluminum or tungsten.

Figure 4:
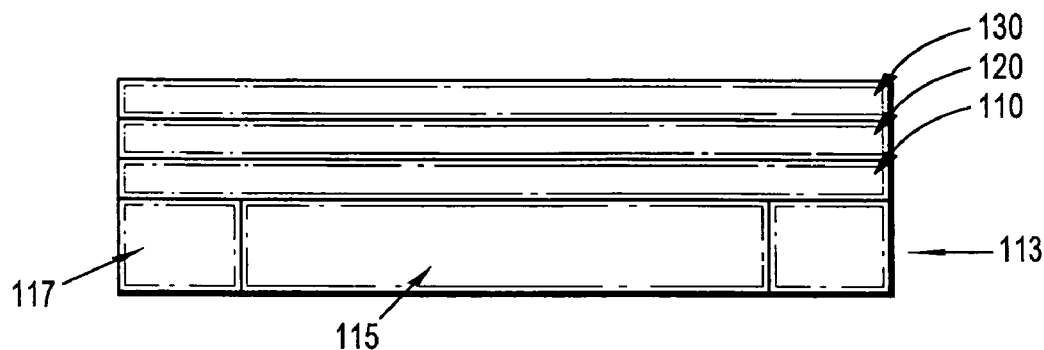
FIGS. 4-13 show various steps of an exemplary embodiment of the method of fabricating a connection device according to the invention.

As shown in FIG. 4, a first dummy layer 110 is formed over the metallization layer 115 and the interlayer dielectric 117, an actuating layer 120 is formed over the first dummy layer 110, and a second dummy layer 130 is formed over the actuating layer 120. The dummy layers 110 and 130 and the actuating layer 120 can be formed by any suitable processes, such as, for example, chemical vapor deposition (CVD) processes. The dummy layers 110 and 120 can be any suitable layers, such as, for example, dielectric layers, such as silicon dioxide layers, or semiconductor layers, such as SiGe layers.

Figure 5:
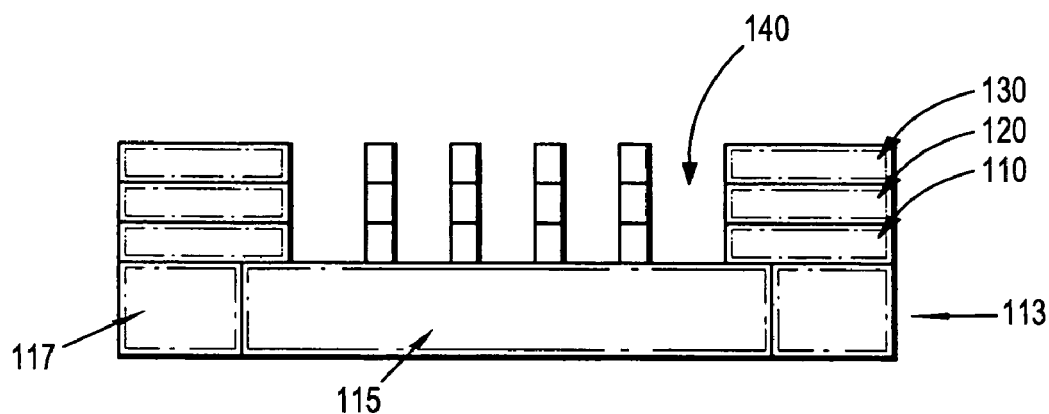

As shown in FIG. 5, a set of vias 140 are formed in the dummy layer 110/actuating layer 120/dummy layer 130 stack. In the present embodiment the actuating layer 120 is made of polysilicon. However, in other embodiments, it should be appreciated that the actuating layer 120 can be formed of any other device/material that is able to change the vias between a conductive state and a non-conductive state, such as an electromagnetic circuit. The vias 140 can be formed by etching using a patterning technique. The patterning technique can be conventional optical lithography or electron beam lithography. Alternatively, self-assembly templating methods can be used to form nanometer-sized vias 140. Examples of self-assembly templating methods include, but are not limited to, di-block copolymers with reactive ion etching, and synthesis and deposition of nanoparticles as etch masks followed by self-aligned anisotropic etching and tone reversal.

Figure 6:
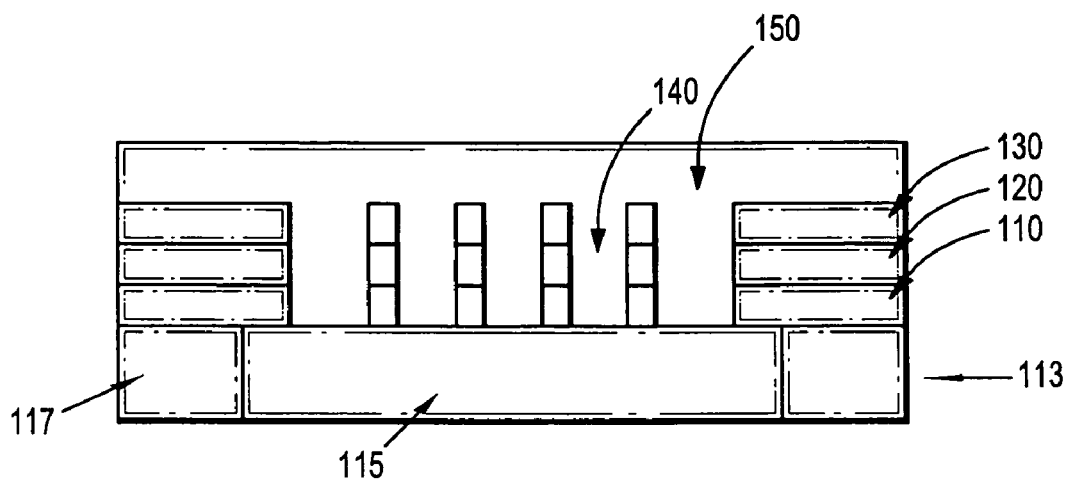
Figure 7:
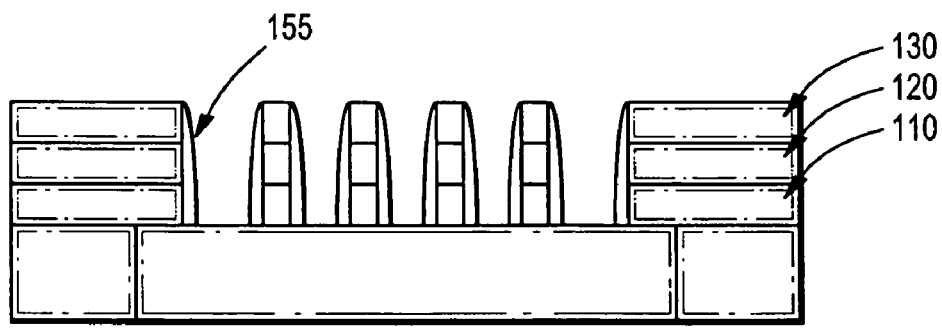

As shown in FIG. 6, a dielectric layer 150 is formed over the dummy layer 110/actuating layer 120/dummy layer 130 stack and in the set of vias 40. The dielectric layer 150 can be any suitable dielectric layer, such as, for example, a silicon dioxide layer. As shown in FIG. 7, spacers 155 are formed around each nanometer-sized holes 140. The spacers 155 can be formed by anisotropic etching of the dielectric layer 150.

Figure 8:
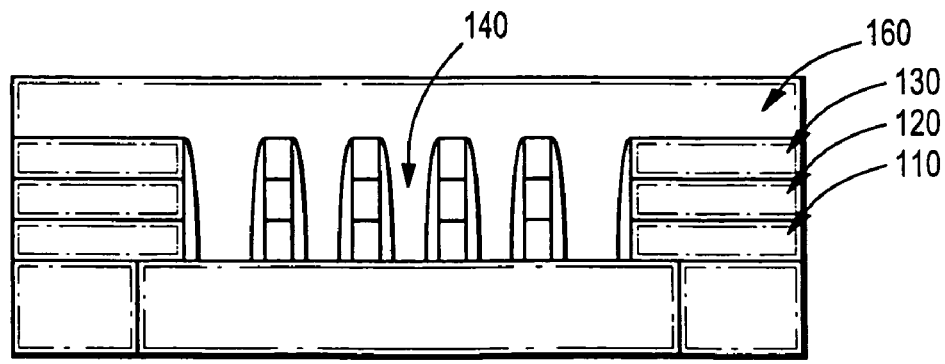

As shown in FIG. 8, a phase change material layer 160 is formed over the dummy layer 110/actuating layer 120/dummy layer 130 stack and in the set of nanometer-sized holes 140. The phase change material layer 160 can be formed of any suitable phase change material, preferably chalcogenides, such as, for example, GST ($Ge_2Sb_2Te_5$).

Figure 9:
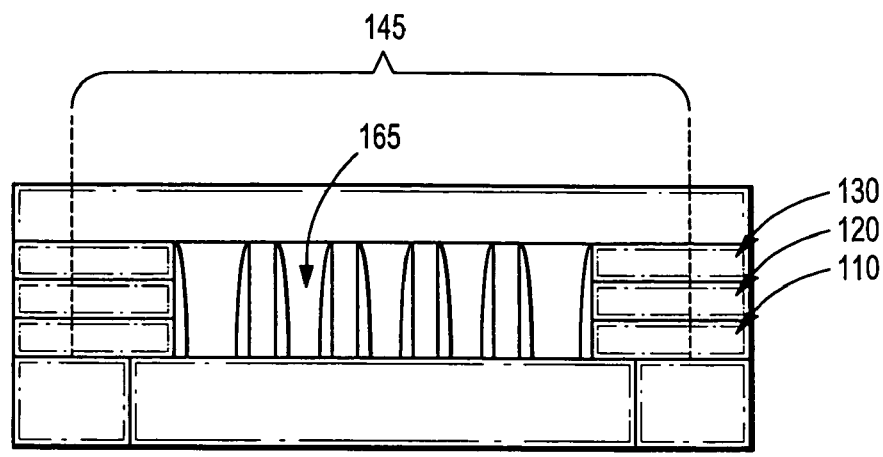

As shown in FIG. 9, the phase change material layer 160 is polished flush with the top surface of the second dummy layer 130 so that pillars 165 of phase change material are formed in the vias 140. The phase change material layer 160 can be polished by any suitable polishing process, such as, for example, chemical-mechanical polishing. The pillars 165 are formed in a via area 145 of the dummy layer 110/actuating layer 120/dummy layer 130 stack.

Figure 10:
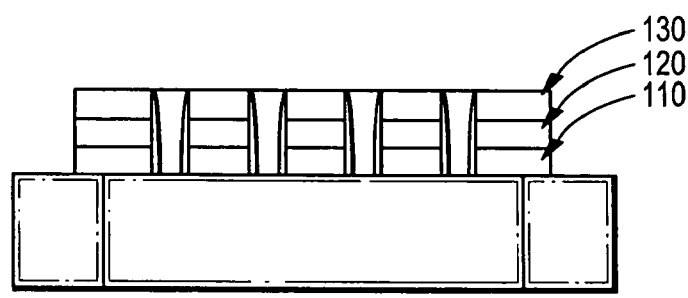

As shown in FIG. 10, the portions of the dummy layer 110/actuating layer 120/dummy layer 130 stack outside the via area 145 are removed by, for example, etching.

Figure 11:
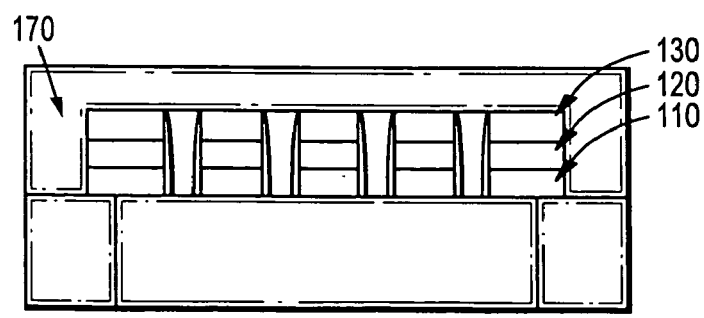

As shown in FIG. 11, a second interlayer dielectric 170 is formed over the dummy layer 110/actuating layer 120/dummy layer 130 stack and the pillars 165. The second interlayer dielectric 170 can be polished flat by any suitable polishing process.

Figure 12:
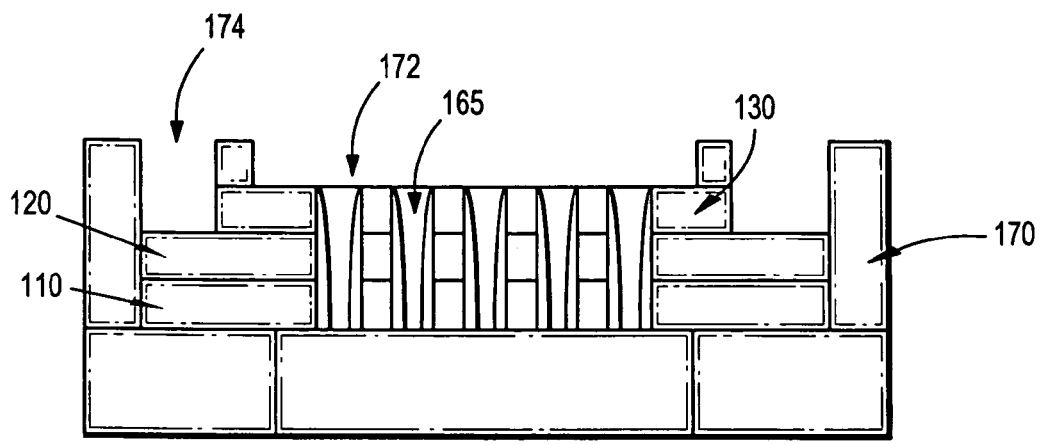

As shown in FIG. 12, portions of the second interlayer dielectric 170 are removed to form first contact holes 172 and second contact holes 174. First contact hole 172 accesses the pillars 165 of phase change material. The second contact holes 174 access the actuating layer 120.

Figure 13:
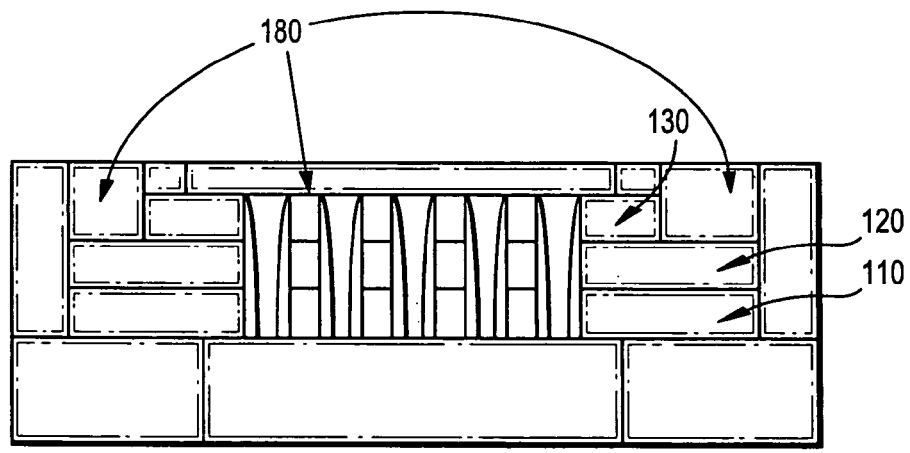

As shown in FIG. 13, the first contact hole 172 and the second contact holes 174 are filled with metallization material 180. The metallization material 180 can be polished flush with the second interlayer dielectric 170 by a polishing process. The metallization material 180 can be any suitable material, such as, for example, tungsten. The metallization layer 180 can then be attached to layers of other integrated circuits.

Figure 14:
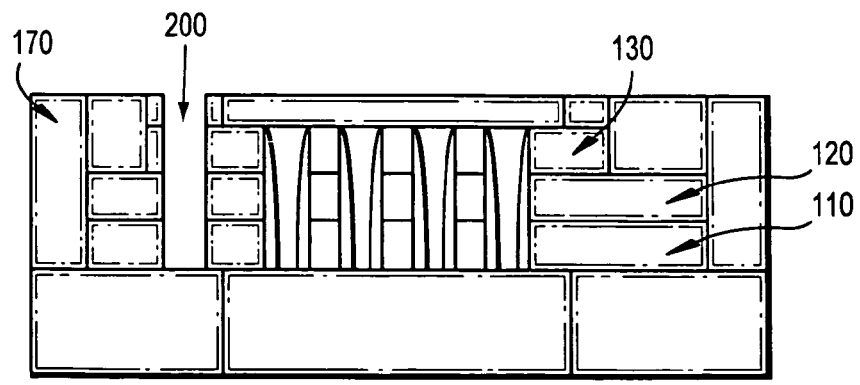
FIGS. 14-16 show various steps of another exemplary embodiment of the method of fabricating a connection device according to the invention.
Figure 15:
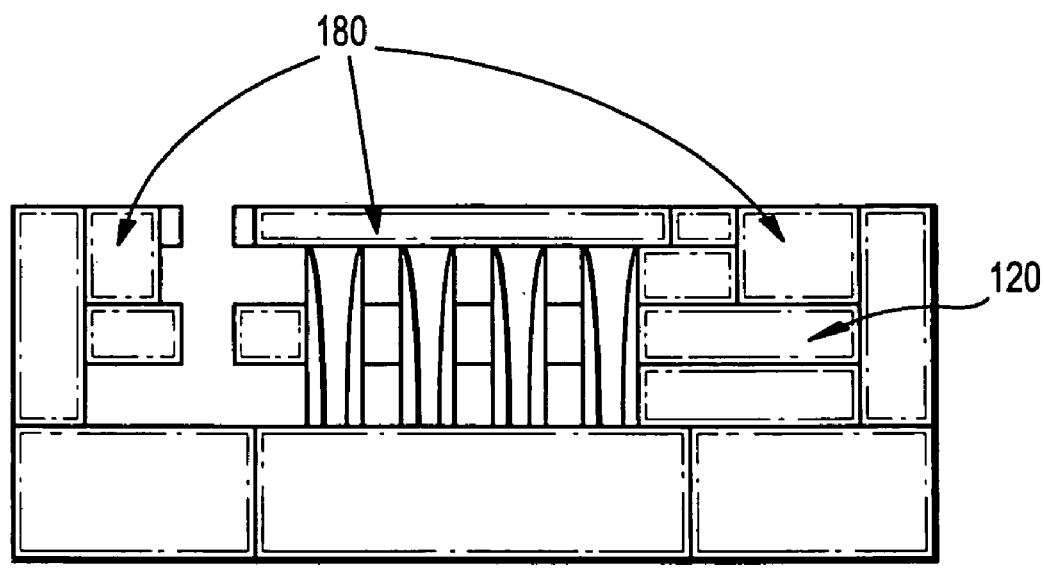
Figure 16:
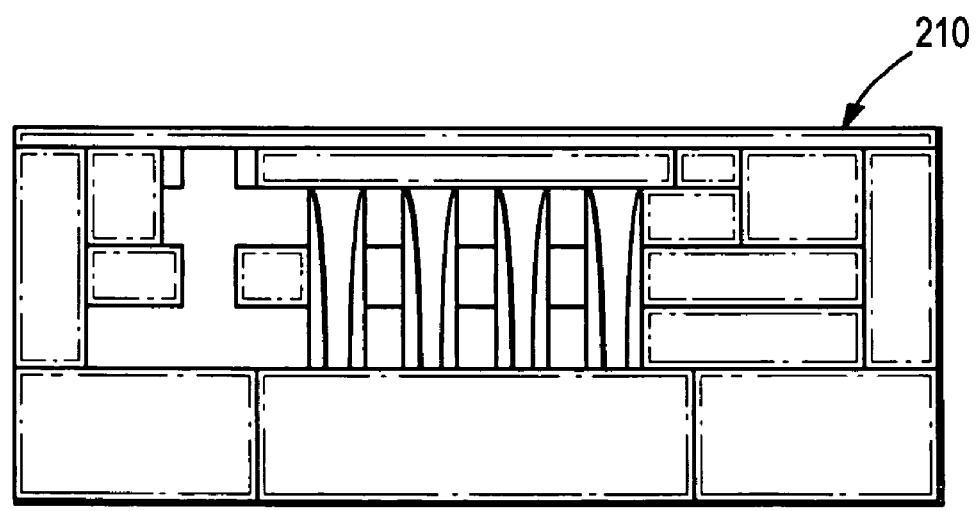

FIGS. 14-16 show various steps of another exemplary embodiment of the method of fabricating a connection device according to the invention. In this embodiment, vias are formed in the same way as in the first embodiment, except the actuating layer 120 is made to be free standing. As shown in FIG. 14, a series of tap holes 200 are formed in the second interlayer dielectric 170/dummy layer 110/ actuating layer 120/dummy layer 130 stack. The tap holes 200 can be formed by etching.

As shown in FIG. 15, the first dummy layer 110 and the second dummy layer 130 are removed to form a freestanding actuating layer 120. The first dummy layer 110 and the second dummy layer 130 can be removed by isotropic etching through the tap holes 200 to undercut the areas above and below the actuating layer 120.

As shown in FIG. 16, an oxide layer 210 is formed over the metallization material 180 and the tap holes 200. The oxide layer 210 seals off the tap holes 200. The oxide layer 210 can be formed by any suitable method, such as, for example, chemical vapor deposition.

Although the illustrative embodiments have been described herein with reference to the accompanying drawings, it is to be understood that the present invention and method are not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A connection device that connects layers of integrated circuits, comprising:
    a first metal layer;
    a second metal layer;
    a plurality of re-configurable vias that connect the first metal layer to the second metal layer; and
    an actuating element disposed between the first metal layer and the second metal layer, the actuating element changing a configuration of the plurality of re-configurable vias so that the plurality of re-configurable vias change between a conductive state and a non-conductive state.

2. The connection device of claim 1, wherein the plurality of re-configurable vias comprise a plurality of re-configurable phase change vias.

3. The connection device of claim 2, wherein each of the plurality of re-configurable phase change vias comprises a nanometer-sized pillar.

4. The connection device of claim 3, wherein the nanometer-sized pillar is made of $Ge_2Sb_2Te_5$.

5. The connection device of claim 3, wherein each of the plurality of re-configurable phase change vias comprises a spacer that surrounds the nano-meter sized pillar.

6. The connection device of claim 2, wherein the actuating element is a resistive heating element.

7. The connection device of claim 6, wherein the resistive heating element is a polysilicon layer.

8. The connection device of claim 6, further comprising a programming circuit that provides current to the resistive heating element to generate heat.

9. The connection device of claim 8, further comprising contacts that electrically connect the programming circuit to the resistive heating element.

10. The connection device of claim 1, further comprising:
    a first dummy layer formed between the first metal layer and the actuating element; and
    a second dummy layer formed between the actuating element and the second metal layer.

11. The connection device of claim 10, wherein the first and second dummy layers are dielectric layers.

12. The connection device of claim 11, wherein the first and second dummy layers are made of silicon dioxide.

13. The connection device of claim 1, wherein the first and second metal layers are made of tungsten.

14. The connection device of claim 1, further comprising an air gap between the actuating element and the first and second metal layers, wherein the actuating element is a resistive heating element.

15. A connection device that connects layers of integrated circuits, comprising:
- a first metal layer;
- a second metal layer;
- a plurality of re-configurable vias that connect the first metal layer to the second metal layer; and
- an actuating element disposed between the first metal layer and the second metal layer, the actuating element changing a configuration of the plurality of re-configurable vias so that the plurality of re-configurable vias change between a conductive state and a non-conductive state, wherein an air gap is disposed between the actuating element and the first and second metal layers.

16. A connection device that connects layers of integrated circuits, comprising:
- a first metal layer;
- a second metal layer;
- a plurality of re-configurable vias that connect the first metal layer to the second metal layer; and
- an actuating element disposed between the first metal layer and the second metal layer, the actuating element changing a configuration of the plurality of re-configurable vias so that the plurality of re-configurable vias change between a conductive state and a non-conductive state,
- wherein the plurality of re-configurable vias comprise a plurality of re-configurable phase change vias, wherein each of the plurality of re-configurable phase change vias comprises a nanometer-sized pillar, and wherein each of the plurality of re-configurable phase change vias comprises a spacer that surrounds the nano-meter sized pillar.

* * * * *